US011953565B2

(12) United States Patent
Romero

(10) Patent No.: US 11,953,565 B2
(45) Date of Patent: Apr. 9, 2024

(54) ELECTRICAL OFFSET COMPENSATING IN A BRIDGE USING MORE THAN FOUR MAGNETORESISTANCE ELEMENTS

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 232 days.

(21) Appl. No.: 17/663,062

(22) Filed: May 12, 2022

(65) Prior Publication Data
US 2022/0308131 A1 Sep. 29, 2022

Related U.S. Application Data

(63) Continuation-in-part of application No. 17/209,471, filed on Mar. 23, 2021, now Pat. No. 11,609,283.

(51) Int. Cl.
G01R 33/09 (2006.01)
G01R 33/00 (2006.01)
H01F 10/32 (2006.01)

(52) U.S. Cl.
CPC ......... *G01R 33/09* (2013.01); *G01R 33/0023* (2013.01); *H01F 10/3268* (2013.01)

(58) Field of Classification Search
CPC .............................. G01R 33/09; G01R 33/0023
See application file for complete search history.

(56) References Cited

U.S. PATENT DOCUMENTS

| 5,619,137 | A  | 4/1997  | Vig et al.     |
|-----------|----|---------|----------------|
| 5,694,038 | A  | 12/1997 | Moody et al.   |
| 6,967,526 | B1 | 11/2005 | Churchill      |
| 7,605,647 | B1 | 10/2009 | Romero et al.  |
| 7,795,862 | B2 | 9/2010  | Doogue et al.  |
| 7,859,255 | B2 | 12/2010 | Doogue et al.  |
| 8,269,491 | B2 | 9/2012  | Cummings et al.|
| 8,736,369 | B2 | 5/2014  | Petrie         |

(Continued)

FOREIGN PATENT DOCUMENTS

| JP | H-02185106 A | 7/1990 |
| JP | H-09246885 A | 9/1997 |
| JP | 2010-136039 A | 6/2010 |

OTHER PUBLICATIONS

PCT International Search Report and Written Opinion dated May 2, 2022 for International Application No. PCT/US2022/016399; 13 Pages.

(Continued)

*Primary Examiner* — Alesa Allgood
(74) *Attorney, Agent, or Firm* — Daly, Crowley, Mofford & Durkee, LLP

(57) ABSTRACT

In one aspect, bridge circuitry includes a first magnetoresistance (MR) element connected with a second MR element at a first node; a third MR element connected with the first MR element at a second node; a fourth MR element connected with the third MR element at a third node; a fifth MR element connected with a sixth MR element at a fourth node; a seventh MR element connected with the fifth MR element at a fifth node; and an eighth MR element connected with the seventh MR element at a sixth node; and a plurality of eight switches. Six of the plurality of eight switches are each connected to a corresponding one node.

33 Claims, 11 Drawing Sheets

(56) References Cited

U.S. PATENT DOCUMENTS

| | | |
|---|---|---|
| 9,046,562 B2 | 6/2015 | Cummings et al. |
| 10,078,117 B2 | 9/2018 | Monreal et al. |
| 10,270,428 B1 | 4/2019 | Geisler et al. |
| 10,310,028 B2 | 6/2019 | Latham et al. |
| 10,324,141 B2 | 6/2019 | Latham et al. |
| 10,444,299 B2 | 10/2019 | Romero et al. |
| 10,481,219 B2 | 11/2019 | Romero et al. |
| 10,641,842 B2 | 5/2020 | Latham et al. |
| 10,649,042 B2 | 5/2020 | Latham et al. |
| 10,837,943 B2 | 11/2020 | Romero |
| 10,917,092 B2 | 2/2021 | Romero |
| 10,996,289 B2 | 5/2021 | Latham et al. |
| 11,073,573 B2 | 7/2021 | Latham et al. |
| 11,115,084 B2 | 9/2021 | Latham et al. |
| 11,125,837 B2 | 9/2021 | Kulla |
| 11,199,424 B2 | 12/2021 | Lassalle-Balier et al. |
| 11,262,422 B2 | 3/2022 | Romero |
| 11,320,496 B2 | 5/2022 | Latham et al. |
| 2006/0284671 A1 | 12/2006 | Ohba |
| 2007/0194847 A1 | 8/2007 | Machida |
| 2011/0115416 A1 | 5/2011 | Oh et al. |
| 2017/0089987 A1 | 3/2017 | Monreal et al. |
| 2018/0003522 A1 | 1/2018 | Ionescu et al. |
| 2021/0223023 A1 | 7/2021 | Romero |
| 2021/0285794 A1 | 9/2021 | Briano et al. |
| 2022/0308131 A1 | 9/2022 | Romero |

OTHER PUBLICATIONS

U.S. Ex Parte Quayle Action dated Nov. 12, 2013 for U.S. Appl. No. 13/533,404; 6 Pages.

Response to U.S. Ex Parte Quayle Action dated Nov. 12, 2013 for U.S. Appl. No. 13/533,404; Response filed Dec. 6, 2013; 19 Pages.

U.S. Notice of Allowance dated Feb. 3, 2014 for U.S. Appl. No. 13/533,404; 6 Pages.

PCT International Search Report and Written Opinion dated Dec. 16, 2013 for International Application No. PCT/US2013/044260; 13 Pages.

PCT International Preliminary Report dated Jan. 8, 2015 for International Application No. PCT/US2013/044260; 6 Pages.

Korean Office Action (with Machine English Translation) dated Apr. 26, 2019 for Korean Application No. 10-2014-7035295; 13 Pages.

Response (with Machine English Translation) to Korean Office Action dated Apr. 26, 2019 for Korean Application No. 10-2014-7035295; Response filed Jun. 18, 2019; 28 Pages.

Korean Notice of Allowance (with Machine English Translation) dated Sep. 2, 2019 for Korean Application No. 10-2014-7035295; 9 Pages.

Japanese Office Action (with Machine English Translation) dated May 17, 2017 for Japanese Application No. 2015-520218; 9 Pages.

Response (with Machine English Translation) to Japanese Office Action dated May 17, 2017 for Japanese Application No. 2015-520218; Response filed Jul. 11, 2017; 14 Pages.

Japanese Decision to Grant (with Machine English Translation) dated Jul. 20, 2017 for Japanese Application No. 2015-520218; 5 Pages.

European Communication Pursuant to Rules 161 and 162 dated Feb. 19, 2015 for European Application No. 13731194.0; 2 Pages.

Response to European Communication Pursuant to Rules 161 and 162 dated Feb. 19, 2015 for European Application No. 13731194.0; Response filed Aug. 28, 2015; 17 Pages.

European Intention to Grant dated Aug. 21, 2018 for European Application No. 13731194.0; 6 Pages.

U.S. 2nd Preliminary Amendment filed on Apr. 1, 2022 for U.S. Appl. No. 17/209,471; 16 Pages.

U.S. Non-Final Office Action dated Nov. 18, 2022 for U.S. Appl. No. 17/209,471; 10 Pages.

Response to U.S. Non-Final Office Action dated Nov. 18, 2022 for U.S. Appl. No. 17/209,471; Response filed Nov. 29, 2022; 20 Pages.

U.S. Notice of Allowance dated Jan. 19, 2023 for U.S. Appl. No. 17/209,471; 11 Pages.

Response to Communication pursuant to Rules 161(1) and 162 EPC Jan. 30, 2024, European Application No. 22706967.1; 23 pages.

ELECTRICAL OFFSET COMPENSATING IN A BRIDGE USING MORE THAN FOUR MAGNETORESISTANCE ELEMENTS

RELATED APPLICATIONS

This application is a continuation-in-part of U.S. patent application Ser. No. 17/209,471, filed Mar. 23, 2021, and titled "ELECTRICAL OFFSET COMPENSATING IN A MAGNETORESISTANCE BRIDGE," which is incorporated herein by reference in its entirety.

BACKGROUND

Magnetic field sensors are used in a variety of applications, including, but not limited to, an angle sensor that senses an angle of a direction of a magnetic field; a current sensor that senses a magnetic field generated by a current carried by a current-carrying conductor; a magnetic switch that senses the proximity of a ferromagnetic object; a rotation detector that senses passing ferromagnetic articles, for example, magnetic domains of a ring magnet or a ferromagnetic target (e.g., gear teeth) where the magnetic field sensor is used in combination with a back-biased or other magnet; a magnetic field sensor that senses a magnetic field density of a magnetic field, a linear sensor that senses a position of a ferromagnetic target; and so forth.

In certain applications, magnetic field sensors include MR elements. As is also known, there are different types of MR elements, for example, a semiconductor MR element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

MR elements have an electrical resistance that changes in the presence of an external magnetic field. Spin valves are also a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields.

SUMMARY

In one aspect, a bridge includes a first magnetoresistance (MR) element; a second MR element connected in series with the first MR element at a first node; a third MR element connected in series with the second MR element at a second node; a fourth MR element connected in series with the third MR element at a third node; a fifth MR element; a sixth MR element connected in series with the fifth MR element at a fourth node; a seventh MR element connected in series with the sixth MR element at a fifth node; and an eighth MR element connected in series with the seventh MR element at a sixth node. The bridge circuitry also includes a first switch connected at one end to a supply voltage and connected at the other end to the first MR element and the fifth MR element; a second switch connected at one end to the supply voltage and connected at the other end to the first node; a third switch connected to the fifth node at one end and connected at the other end to a first output terminal of the bridge circuitry; a fourth switch connected to the fourth node at one end and connected at the other end to the first output terminal; a fifth switch connected to the second node at one end and connected at the other end to a second output terminal of the bridge circuitry; a sixth switch connected at one end to the third node and the other end to the second output terminal; a seventh switch connected at one end to ground and connected at the other end to the fourth MR element and the eight MR element; and an eighth switch connected at one end to ground and connected at the other end to the sixth node.

In another aspect, a magnetic-field sensor incudes bridge circuitry. The bridge circuitry includes a first magnetoresistance (MR) element; a second MR element connected in series with the first MR element at a first node; a third MR element connected in series with the second MR element at a second node; a fourth MR element connected in series with the third MR element at a third node; a fifth MR element; a sixth MR element connected in series with the fifth MR element at a fourth node; a seventh MR element connected in series with the sixth MR element at a fifth node; an eighth MR element connected in series with the seventh MR element at a sixth node. The bridge also includes a first switch connected at one end to a supply voltage and connected at the other end to the first MR element and the fifth MR element; a second switch connected at one end to the supply voltage and connected at the other end to the first node; a third switch connected to the fifth node at one end and connected at the other end to a first output terminal of the bridge circuitry; a fourth switch connected to the fourth node at one end and connected at the other end to the first output terminal; a fifth switch connected to the second node at one end and connected at the other end to a second output terminal of the bridge circuitry; a sixth switch connected at one end to the third node and the other end to the second output terminal; a seventh switch connected at one end to ground and connected at the other end to the fourth MR element and the eight MR element; and an eighth switch connected at one end to ground and connected at the other end to the sixth node.

In a further aspect, bridge circuitry includes a first magnetoresistance (MR) element connected with a second MR element at a first node; a third MR element connected with the first MR element at a second node; a fourth MR element connected with the third MR element at a third node; a fifth MR element connected with a sixth MR element at a fourth node; a seventh MR element connected with the fifth MR element at a fifth node; and an eighth MR element connected with the seventh MR element at a sixth node; and a plurality of eight switches. Six of the plurality of eight switches are each connected to a corresponding one node.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope

DETAIL DESCRIPTION

Described herein are techniques to compensate for an electrical offset in bridges that include magnetoresistance (MR) elements or MR bridges. Unlike Hall plates or vertical Hall devices, which can be modeled as Wheatstone bridges, bridges with MR elements cannot be current spun to remove their electrical offset, since they are built out of individual elements arranged as a Wheatstone bridge. Mismatches between MR elements in the MR bridge will manifest as an electrical offset component even in the absence of any applied magnetic field. The techniques described herein compensate for the electrical offset while a magnetic is applied to the MR bridge, which allows electrical offset and offset drift components to be removed, which significantly improves the accuracy of the MR bridge compared to not having any sort of compensation.

As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

As used herein, the term "target" is used to describe an object to be sensed or detected by a magnetic-field sensor or a magnetoresistance element. The target may include a conductive material that allows for eddy currents to flow within the target, for example a metallic target that conducts electricity.

Figure 1:
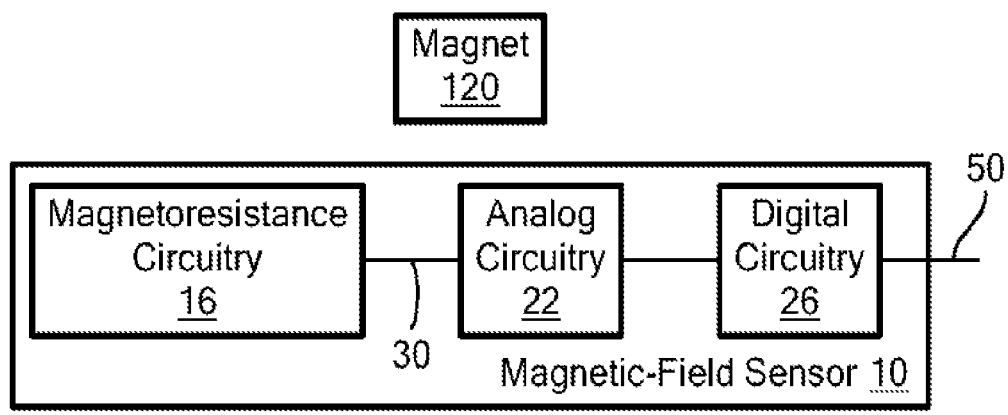
FIG. 1 is a diagram of an example of a magnetic-field sensor.

Referring to FIG. 1, a magnetic-field sensor 10 may include magnetoresistance circuitry 16, analog circuitry 22 and digital circuitry 26. The magnetoresistance detects changes in a magnetic field from a magnet 120.

The analog circuitry 22 is configured to receive an output signal 30 from the magnetoresistance circuitry 16. The analog circuitry 22 also converts the baseband signal from an analog signal to a digital signal.

The digital circuitry 26 receives the digital signal from the analog circuitry 22 and, for example, filters the digital signal. The filtered digital b signal is provided by the digital circuitry 26 as an output signal 50 of the magnetic field sensor 10. In some examples, the output signal may indicate the angle and/or position of the magnet 120.

Figure 2:
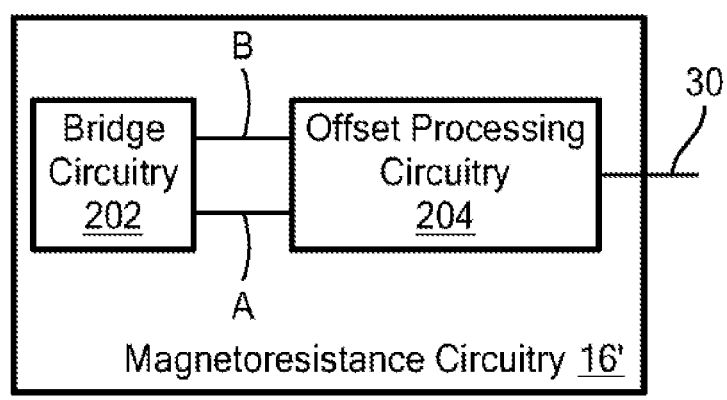
FIG. 2 is a diagram of an example of magnetoresistance circuitry.

Referring to FIG. 2, an example of magnetoresistance circuitry 16 (FIG. 1) that compensates for an electrical offset in a MR bridge is magnetoresistance circuitry 16'. The magnetoresistance circuitry 16' includes bridge circuitry 202 and offset processing circuitry 204. The bridge circuit 202 has an output A and an output B, which is received by the offset processing circuitry 204. The offset processing circuitry 204 processes the outputs A and B to generate the output signal 30 that removes the effects of the electrical offset.

Figure 3A:
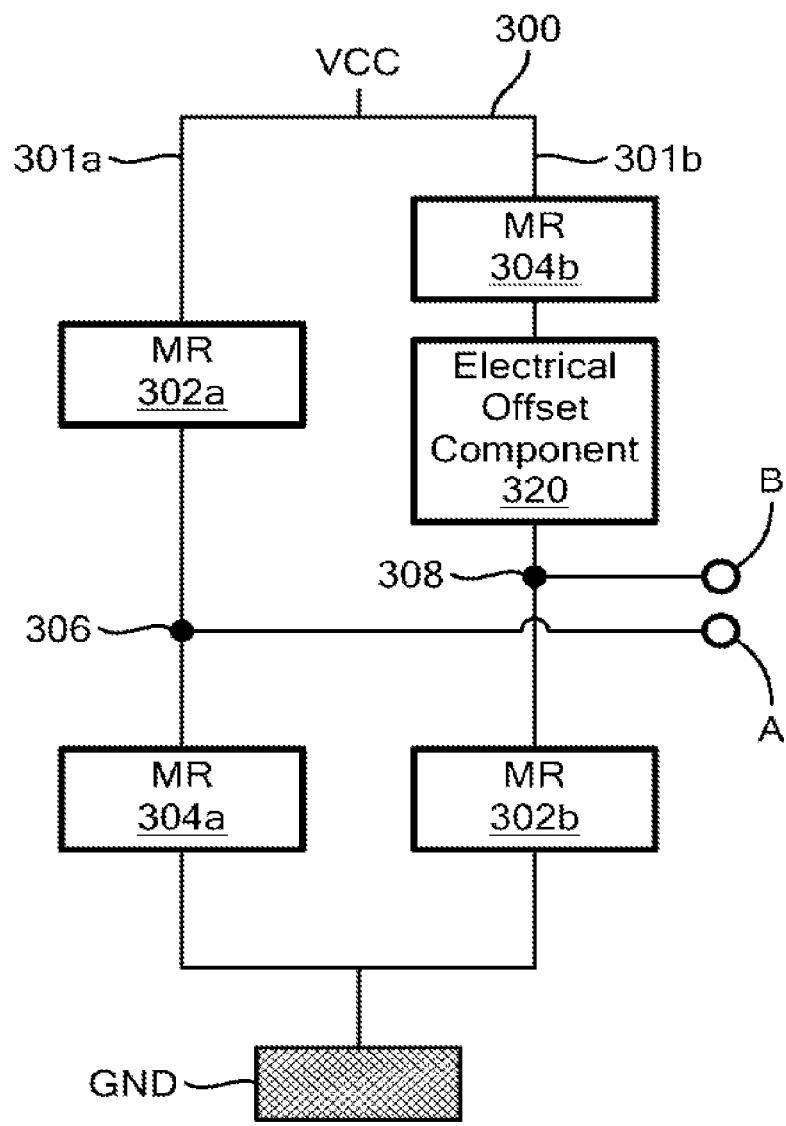
FIG. 3A is a diagram of a prior art bridge having magnetoresistance elements and an electrical offset.

Referring to FIG. 3A, a prior art bridge that includes MR elements is a MR bridge 300. The MR bridge 300 has a left leg 301a and a right leg 301b.

The MR bridge 300 includes an MR element 302a in series with an MR element 304a. The MR element 302a and the MR element 304a form the left leg 301a of the MR bridge 300.

The MR element 302a is connected to a supply voltage VCC and the MR element 304a is connected to the ground (GND). Between the MR element 302a and the MR element 304a is a first node 306 that forms an output A.

The MR bridge 300 also includes an MR element 302b in series with an MR element 304b. The MR element 304b is connected to the supply voltage VCC and the MR element 302b is connected to the ground (GND). Between the MR element 302b and the MR element 304b is a second node 308 that forms an output B. The voltage output of the MR bridge 300 is the difference between the output A and the output B.

The MR element 302a and the MR element 302b are fabricated to have the same magnetic-field characteristics (e.g., reference angle, electrical resistance and so forth). In one example, the MR element 302a and the MR element 302b have substantially the same reference angle within a few degrees, where the reference angle is the angle that the MR element is most sensitive to changes in an external magnetic field. In another example, the MR element 302*a* and the MR element 302*b* have substantially the same electrical resistance within a hundred ohms as a function of the magnetic field. For example, the MR element 302*a* and the MR element 302*b* each have an electrical resistance R2(B), where B is the magnetic field.

The MR element 304*a* and the MR element 304*b* are fabricated to have the same magnetic-field characteristics (e.g., reference angle, electrical resistance and so forth). In one example, the MR element 304*a* and the MR element 304*b* have substantially the same reference angle within a few degrees. In another example, the MR element 304*a* and the MR element 304*b* have substantially the same electrical resistance within a hundred ohms as a function of the magnetic field. For example, the MR element 304*a* and the MR element 304*b* each have an electrical resistance R1(B).

In one particular example, the bridge 300 is a magnetometer. The MR elements 302*a*, 302*b*, 304*a*, 304*b* detect the same external magnetic field (not shown). The reference angles for the MR elements 302*a*, 302*b* are in the same direction as the direction of the external magnetic field and opposite to the reference angles of the MR elements 304*a*, 304*b*.

In another particular example, the bridge 300 is a gradiometer. The reference angles for the MR elements 302*a*, 302*b*, 304*a*, 304*b* are in the same direction. In this configuration, the MR elements 302*a*, 302*b* detect an external magnetic field that is an opposite direction from an external magnetic field detected by the MR elements 304*a*, 304*b*.

However, mismatches due to fabrication, for example, are formed between the MR elements 302*a*, 302*b*, 304*a*, 304*b* producing an electrical offset. In FIG. 3A, an electrical offset is represented by an electrical offset component 320 disposed between the MR element 304*b* and the second node 308. The MR element 302*b*, MR element 304*b* and the electrical offset component 320 form the left leg 301*b* of the MR bridge 300.

With the resistance of the electrical offset component 320 represented as $\Delta R$, the voltage output of the MR bridge 300 is a function of the magnetic field and is expressed as:

$$Vout(B) = \frac{R2(B)}{R1(B) + R2(B) + \Delta R} \cdot VCC - \frac{R1(B)}{R1(B) + R2(B)} \cdot VCC$$

$$Vout(B) = \frac{R2(B) \cdot (R1(B) + R2(B)) - R1(B) \cdot (R1(B) + R2(B) + \Delta R)}{(R1(B) + R2(B) + \Delta R) \cdot (R1(B) + R2(B))} \cdot VCC$$

If $\Delta R \ll R1+R2$, then:

$$Vout(B) = \frac{\left(R2(B) - R1(B) \cdot \left(1 + \frac{\Delta R}{R1(B) + R2(B)}\right)\right) \cdot (R1(B) + R2(B))}{(R1(B) + R2(B))^2} \cdot VCC$$

$$Vout(B) = \frac{R2(B) - R1(B) - \frac{R1(B) \cdot \Delta R}{R1(B) + R2(B)}}{R1(B) + R2(B)} \cdot VCC$$

Since $$\frac{R1(B)}{R1(B) + R2(B)} \cong \frac{1}{2}$$

for small B variations, then:

$$Vout(B) \cong \frac{R2(B) - R1(B) - \frac{\Delta R}{2}}{R1(B) + R2(B)} \cdot VCC.$$

The output of the MR bridge 300 is proportional to the resistance difference between the legs 301*a*, 301*b* of the MR bridge 300 caused by changes in the magnetic field. If there is a fixed unbalance between both legs (represented herein by $\Delta R$, which does not depend on the magnetic field) that will add to the output voltage as an error component. If the sensed magnetic signals are baseband signals, then the electrical offset generated by $\Delta R$ cannot be distinguished from the magnetic signal (as it is the case if a current spinning method was used with Hall plates). Even when there is no magnetic field applied, an output voltage different from zero will exist:

$$Vout(B) = \frac{R2(0) - R1(0) - \frac{\Delta R}{2}}{R1(0) + R2(0)} \cdot VCC = -\frac{\Delta R/2}{R_{LEG}} \cdot VCC,$$

since the mismatch term is represented by $\Delta R$, it is assumed that R2(B=0)=R1(B=0), while $R1+R2=R_{LEG}$ for any applied magnetic field.

In one example, the MR elements 302*a*, 302*b*, 304*a*, 304*b* may each be a TMR element. In another example, the MR elements 302*a*, 302*b*, 304*a*, 304*b* may each be a GMR element. In a further example, one or more of the MR elements 302*a*, 302*b*, 304*a*, 304*b* may be either a TMR element or a GMR element.

Figure 3B:
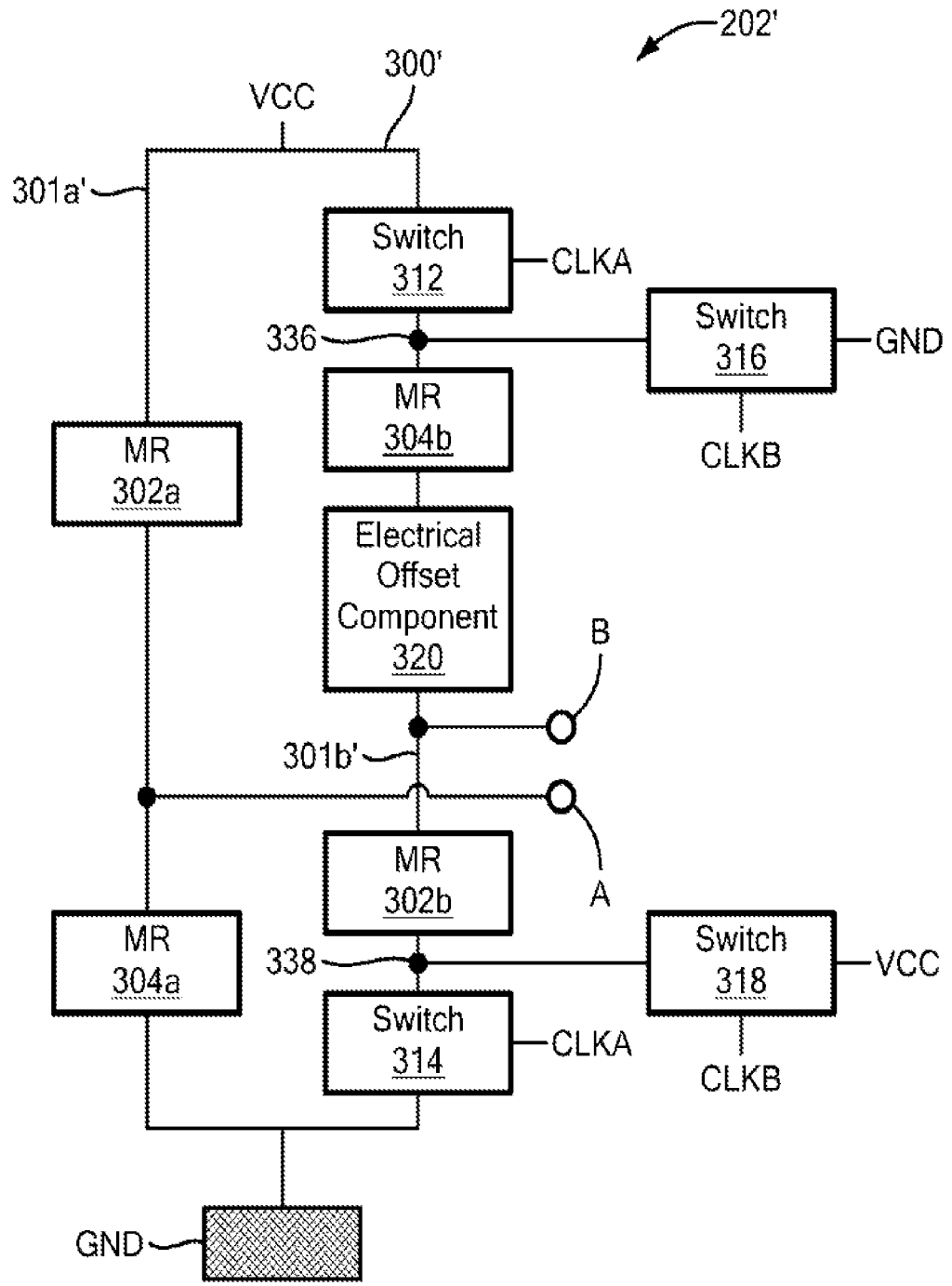
FIG. 3B is diagram of an example of bridge circuitry used to remove the effects of the electrical offset found in the prior art bridge circuitry of FIG. 3A.

Referring to FIG. 3B, an example of the bridge circuitry 202 (FIG. 2) is bridge circuitry 202' that removes the electrical offset component 320.

The bridge circuitry 202' includes a MR bridge 300'. The MR bridge 300' includes a left leg 301*a*' and a right leg 301*b*'. As will be further described herein, the output voltage of the MR bridge 300' is measured in a first mode; and the right leg 301*b*' can be inverted and the output voltage of the MR bridge 300' may be measured again in a second mode. The two output voltages of the MR bridge 300' for each mode may be used to remove the effects of the electrical offset 320.

The MR bridge 300' is like the MR bridge 300 but includes additional electrical components. The MR element 302*b* and the MR element 304*b* form the left leg 301*a*' of the MR bridge 300'. The MR element 302*b*, MR element 304*b* and the electrical offset component 320 form the right leg 301*b*' of the MR bridge 300'.

For example, the bridge circuitry 202' includes a switch 312 that is disposed between the supply voltage VCC and the MR element 304*b*; a switch 314 that is disposed between the MR element 202*b* and ground.

The bridge circuitry 202' also includes a switch 316 and a switch 318. The switch 316 is connected at one end to a third node 336 located between the switch 312 and the MR element 304*b*, and the switch 316 is connected at the other end to ground. The switch 318 is connected at one end to a fourth node 338 located between the switch 314 and the MR element 302*b*, and the switch 318 is connected at the other end to the supply voltage VCC.

Figure 4:
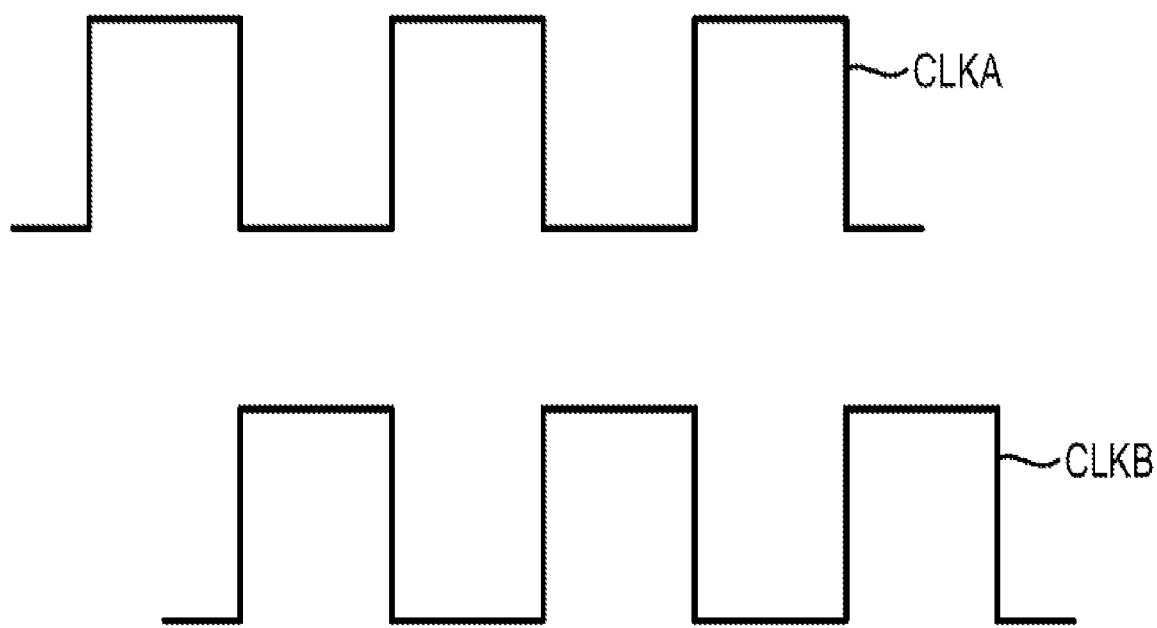
FIG. 4 is a graph of an example of a timing diagram of a first clock signal CLKA and a second clock signal CLKB.

The switches 312, 314 receive a clock signal CLKA. The switches 316, 318 receive a clock signal CLKB. One example of the clock signals CLKA and CLKB is depicted in FIG. 4.

When clock signal CLKA is at a high voltage level, the clock signal CLKB is at a low voltage level. This scenario is called a first mode.

When clock signal CLKA is at a low voltage level, the clock signal CLKB is at a high voltage level. This scenario is called a second mode.

In some examples, one or more of the switches 312, 314, 316, 318 may be a transistor. The transistor may be, for example, an n-type metal-oxide-semiconductor (NMOS) transistor.

In other examples, the bridge circuitry 202' may include additional switches on the left leg 301a' of the bridge 300' to compensate for the effect (e.g., resistance, parasitic capacitance and so forth) caused by the switches 312, 314. These additional switches on the left leg 301a' would be closed (i.e., in the "on" position) whether in the first mode or the second mode.

Figure 5B:
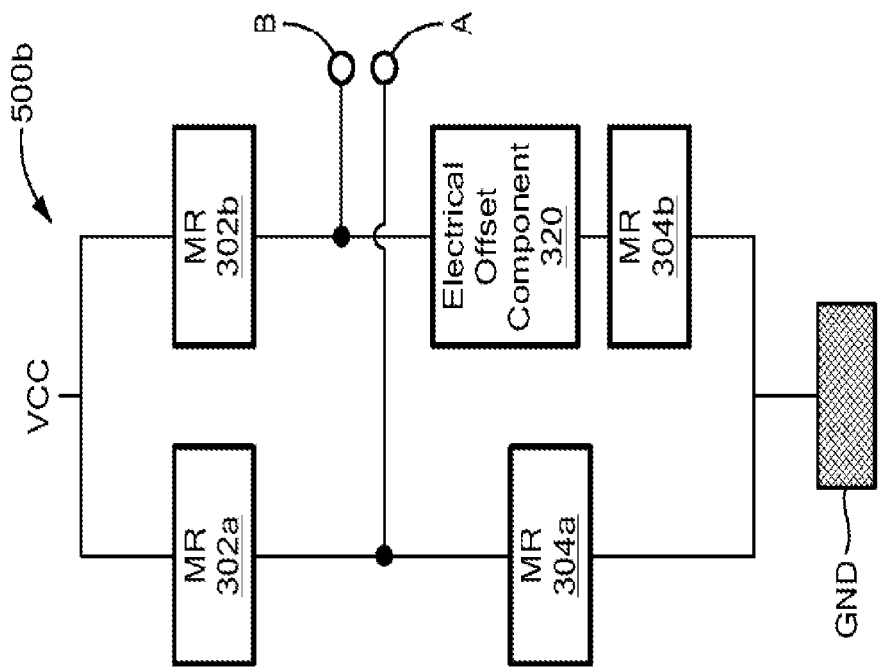
FIG. 5B is a diagram of an example of an equivalent bridge circuit of the bridge circuitry in FIG. 3B when the first clock signal CLKA is at the low voltage level and the second clock signal CLKB is at the high low voltage level.
Figure 5A:
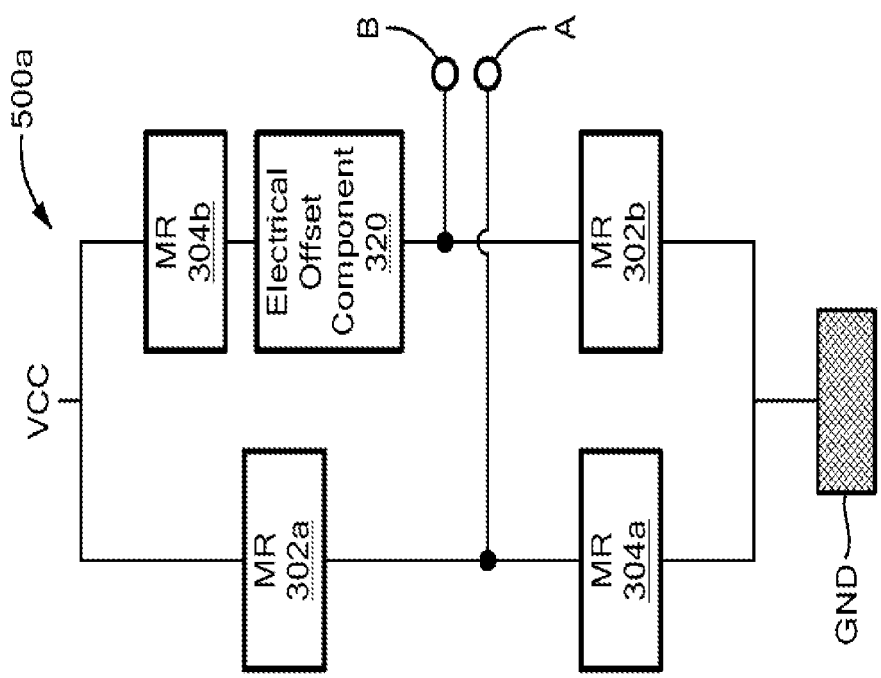
FIG. 5A is diagram of an example of an equivalent bridge circuit of the bridge circuitry in FIG. 3B when the first clock signal CLKA is at a high voltage level and the second clock signal CLKB is at a low voltage level.

Referring to FIGS. 5A and 5B, an example of an equivalent bridge circuit of the bridge circuitry 202' (FIG. 3B) in the first mode is a bridge circuit 500a. The output voltage of the bridge circuit 500a is:

$$\text{Vout\_1st mode}(B) \cong \frac{R2(B) - R1(B) - \Delta R/2}{R1(B) + R2(B)} \cdot VCC,$$

which is the same as bridge 300 (FIG. 3A), since closing switches 312, 314 and opening the switches 316 and 318 makes bridge circuit 500a equivalent to the bridge 300 (FIG. 3A).

An example of an equivalent bridge circuit of the bridge circuitry 202' (FIG. 3B) in the second mode is a bridge circuit 500b. The output voltage of the bridge 500b is:

$$\text{Vout\_2nd mode}(B) = \frac{R1(B) + \Delta R}{R1(B) + R2(B) + \Delta R} \cdot VCC - \frac{R1(B)}{R1(B) + R2(B)} \cdot VCC =$$

$$\frac{(R1(B) + \Delta R) \cdot (R1(B) + R2(B)) - R1(B) \cdot (R1(B) + R2(B) + \Delta R)}{(R1(B) + R2(B) + \Delta R) \cdot (R1(B) + R2(B))} \cdot VCC$$

For $\Delta R \ll R1+R2$, then Vout_$2^{nd}$ mode (B) equals $$= \frac{\left(R1(B) + \Delta R - R1(B) \cdot \left(1 + \frac{\Delta R}{R1(B) + R2(B)}\right)\right) \cdot (R1(B) + R2(B))}{(R1(B) + R2(B))^2} \cdot VCC =$$

$$\frac{\Delta R - \frac{R1(B) \cdot \Delta R}{R1(B) + R2(B)}}{R1(B) + R2(B)} \cdot VCC$$

Since $$\frac{R1(B)}{R1(B) + R2(B)} \cong \frac{1}{2},$$

for small B variations then $$\text{Vout\_2nd mode}(B) \cong \frac{\Delta R - \frac{\Delta R}{2}}{R1(B) + R2(B)} \cdot VCC$$

$$\text{Vout\_2nd mode}(B) \cong \frac{\frac{\Delta R}{2}}{R1(B) + R2(B)} \cdot VCC.$$

Thus, adding Vout_2 nd mode(B) to Vout_1st mode(B) equals:

$$\frac{R2(B) - R1(B)}{R1(B) + R2(B)} \cdot VCC,$$

which does not include the electrical offset expression ΔR.

In one example, the rate the bridge circuitry 202' switches from the first mode to the second mode and back to the first mode (called a switching frequency) is more than the maximum signal frequency of the magnetic-field sensor 10 (FIG. 1). In another example, the switching frequency may be twice the maximum signal frequency of the magnetic-field sensor 10 (FIG. 1). In a further example, the switching frequency is greater than 1 kHz. In other examples, the switching frequency is faster than an electrical offset drift generated by a temperature drift.

Figure 6A:
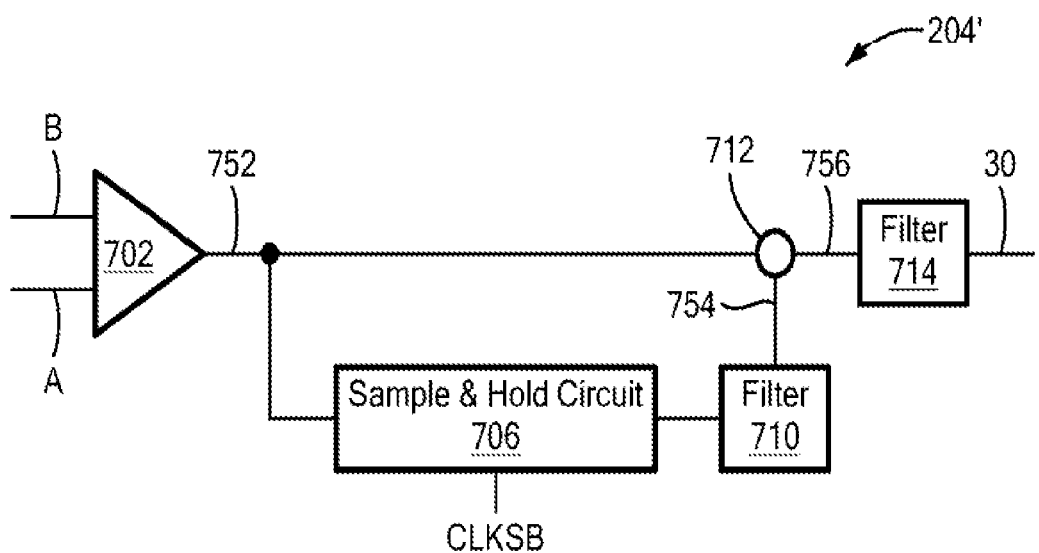
FIG. 6A is a diagram of one example of offset processing circuitry.

Referring to FIG. 6A, an example of the offset processing circuitry 204 (FIG. 2) is an offset processing circuitry 204'. The offset processing circuitry 204' includes a differential amplifier 702, a sample & hold (S&H) circuit 706, a filter 710, an adder 712 and a filter 714.

The difference of the voltage signals A, B are received and amplified by the differential amplifier 702 to form a signal 752. The signal 752 is received by the S&H circuit 706. During the second mode, when the second clock signal CLKB is at a high voltage level, S&H circuit samples and holds the error offset component.

The S&H circuit 706 is controlled by a second clock sample signal CLKSB. In one example, when the second clock sample signal CLKSB is at a high voltage level, a sample of the signal 752 is taken and when the second clock sample signal CLKSB is at a logical low voltage level no sample of signal 752 is taken. The sample taken is the error component.

Figure 6B:
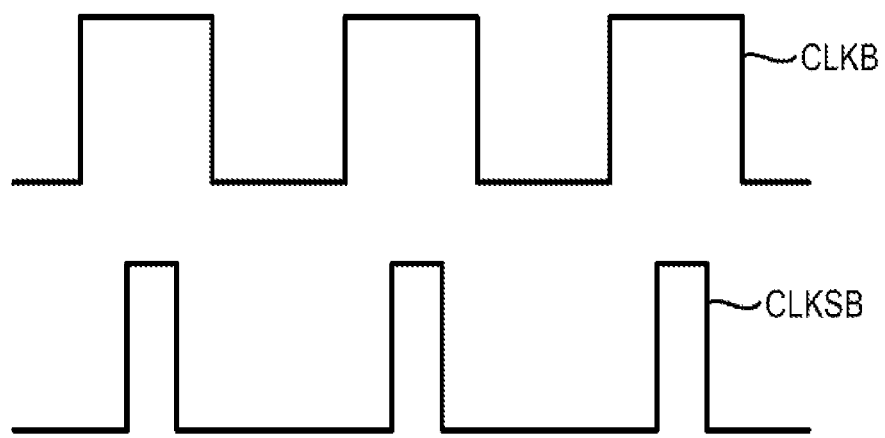
FIG. 6B is a graph of an example of a timing diagram of the second clock signal CLKB and a second clock sample signal CLKSB.

In one example, the second clock sample signal CLKSB may be the same as the second clock signal CLKB. In other examples, the second clock sample signal CLKSB may have a smaller duty cycle than the second clock signal CLKB, but the second clock sample signal CLKSB is only at a high voltage level when the second clock signal is at a high voltage level as depicted in FIG. 6B.

The filter 710 filters the error component. In one example, the filter 710 is a low pass filter. The adder 712 adds the error component from the signal 752 to produce a signal 756, which is filtered by the filter 714 to produce the signal 30. In one example, the filter 714 is a low-pass filter.

Figure 7A:
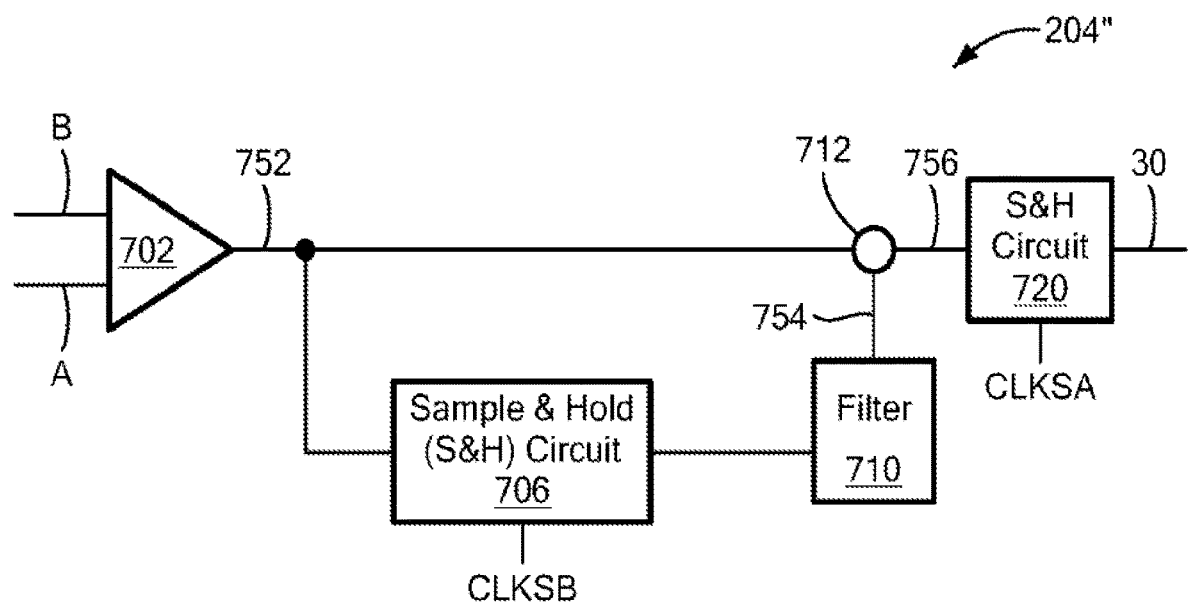
FIG. 7A is a diagram of another example of the offset processing circuitry.

Referring to FIG. 7A, another example of the offset processing circuitry 204 (FIG. 2) is an offset processing circuitry 204". The offset processing circuitry 204" is the same as the offset circuitry 204' (FIG. 6A) except the filter 714 (FIG. 6A) is replaced by a S&H circuit 720. This may be desirable if the filter 714 (FIG. 6A) takes too long to settle.

The S&H circuit 720 is controlled by a first clock sample signal CLKSA. In one example, when the first clock sample signal CLKSA is at a high voltage level, a sample of the signal 756 is taken and when the first clock sample signal CLKSA is at a logical low voltage level no sample of signal 756 is taken. The sample taken is the output voltage of the MR bridge without the error component.

Figure 7B:
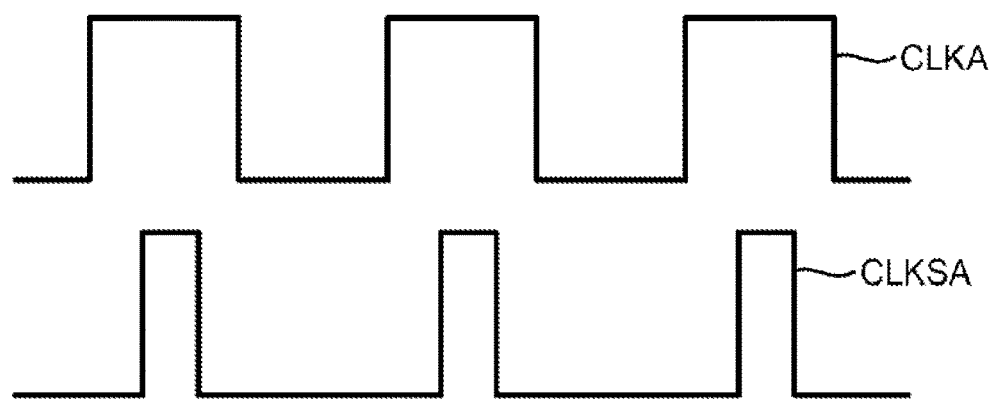
FIG. 7B is a graph of an example of a timing diagram of the first clock signal CLKA and a first clock sample signal CLKSB.

In one example, the first clock sample signal CLKSA may be the same as the first clock signal CLKA. In other examples, the first clock sample signal CLKSA may have a smaller duty cycle than the first clock signal CLKA, but the first clock sample signal CLKSA is only at a high voltage level when the first clock signal is at a high voltage level as depicted in FIG. 7B.

Figure 8:
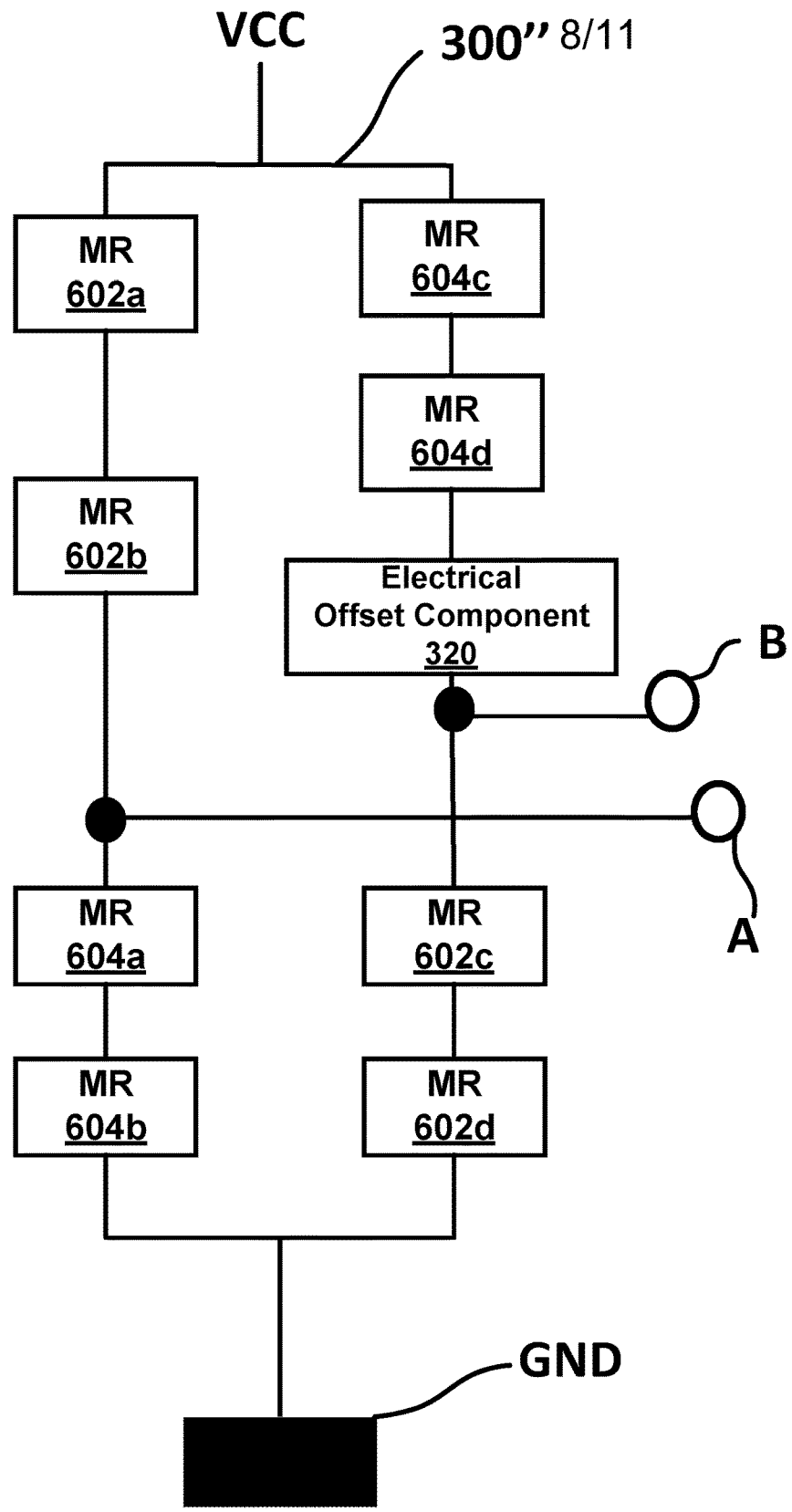
FIG. 8 is a diagram of an equivalent circuit to FIG. 3A.

Referring to FIG. 8, another example of the bridge circuit 300 (FIG. 3A) is a bridge circuit 300", which is equivalent to the bridge circuit 300 (FIG. 3A) except each of the MR elements 302a, 302b, 304a, 304b have been replaced by two MR elements that are equivalent.

The MR element 302a (FIG. 3A) is replaced with MR elements 602a, 602b. The MR elements 602a, 602b each are half the resistance of the MR element 302a (FIG. 3A). The MR elements 602a, 602b each have the same reference angle as the MR element 302a (FIG. 3A). In one example, the elements 602a, 602b each are formed from half a number of pillars as a number of pillars that form the MR element 302a (FIG. 3A).

The MR element 302b (FIG. 3A) is replaced with MR elements 602c, 602d. The MR elements 602c, 602d each are half the resistance of the MR element 302b (FIG. 3A). The MR elements 602c, 602d each have the same reference angle as the MR element 302b (FIG. 3A). In one example, the elements 602c, 602d each are formed from half a number of pillars as a number of pillars that form the MR element 302b (FIG. 3A).

The MR element 304a (FIG. 3A) is replaced with MR elements 604a, 604b. The MR elements 604a, 604b each are half the resistance of the MR element 304a (FIG. 3A). The MR elements 604a, 604b each have the same reference angle as the MR element 304a (FIG. 3A). In one example, the elements 604a, 604b each are formed from half a number of pillars as a number of pillars that form the MR element 304a (FIG. 3A).

The MR element 304b (FIG. 3A) is replaced with MR elements 604c, 604d. The MR elements 604c, 604d each are half the resistance of the MR element 304b (FIG. 3A). The MR elements 604c, 604d each have the same reference angle as the MR element 304b (FIG. 3A). In one example, the elements 604c, 604d each are formed from half a number of pillars as a number of pillars that form the MR element 304b (FIG. 3A).

The MR elements 602a, 602b, 602c, 602d are fabricated to have the same magnetic-field characteristics (e.g., reference angle, electrical resistance and so forth). In one example, the MR elements 602a, 602b, 602c, 602d have substantially the same reference angle within a few degrees, where the reference angle is the angle that the MR element is most sensitive to changes in an external magnetic field. In another example, the MR elements 602a, 602b, 602c, 602d have substantially the same electrical resistance within a hundred ohms as a function of the magnetic field. For example, the MR elements 602a, 602b, 602c, 602d each have an electrical resistance R1(B)/2, where B is the magnetic field.

The MR elements 604a, 604b, 604c, 604d are fabricated to have the same magnetic-field characteristics (e.g., reference angle, electrical resistance and so forth). In one example, the MR elements 604a, 604b, 604c, 604d have substantially the same reference angle within a few degrees. In another example, the MR elements 604a, 604b, 604c, 604d have substantially the same electrical resistance within a hundred ohms as a function of the magnetic field. For example, the MR elements 604a, 604b, 604c, 604d each have an electrical resistance R2(B)/2.

In one particular example, the bridge 300" is a magnetometer. The MR elements 602a, 602b, 602c, 602d, 604a, 604b, 604c, 604d detect the same external magnetic field (not shown). The reference angles for the MR elements 602a, 602b, 602c, 602d are in the same direction as the direction of the external magnetic field and opposite to the reference angles of the MR elements 604a, 604b, 604c, 604d.

In another particular example, the bridge 300" is a gradiometer. The reference angles for the MR elements 602a, 602b, 602c, 602d, 604a, 604b, 604c, 604d are in the same direction. In this configuration, the MR elements 602a, 602b, 602c, 602d, detect an external magnetic field that is an opposite direction from an external magnetic field detected by the MR elements 604a, 604b, 604c, 604d.

The output of the bridge 300" is the same as the output of the bridge 300 or $$Vout(B) \cong \frac{R2(B) - R1(B) - \frac{\Delta R}{2}}{R1(B) + R2(B} \cdot VCC.$$

When there is no magnetic field applied, an output voltage different from zero will exist:

$$Vout(B) = \frac{R2(0) - R1(0) - \frac{\Delta R}{2}}{R1(0) + R2(0} \cdot VCC = -\frac{\Delta R/2}{R_{LEG}} \cdot VCC,$$

since the mismatch term is represented by $\Delta R$, it is assumed that R2(B=0)=R1(B=0), while R1+R2=$R_{LEG}$ for any applied magnetic field.

Figure 9:
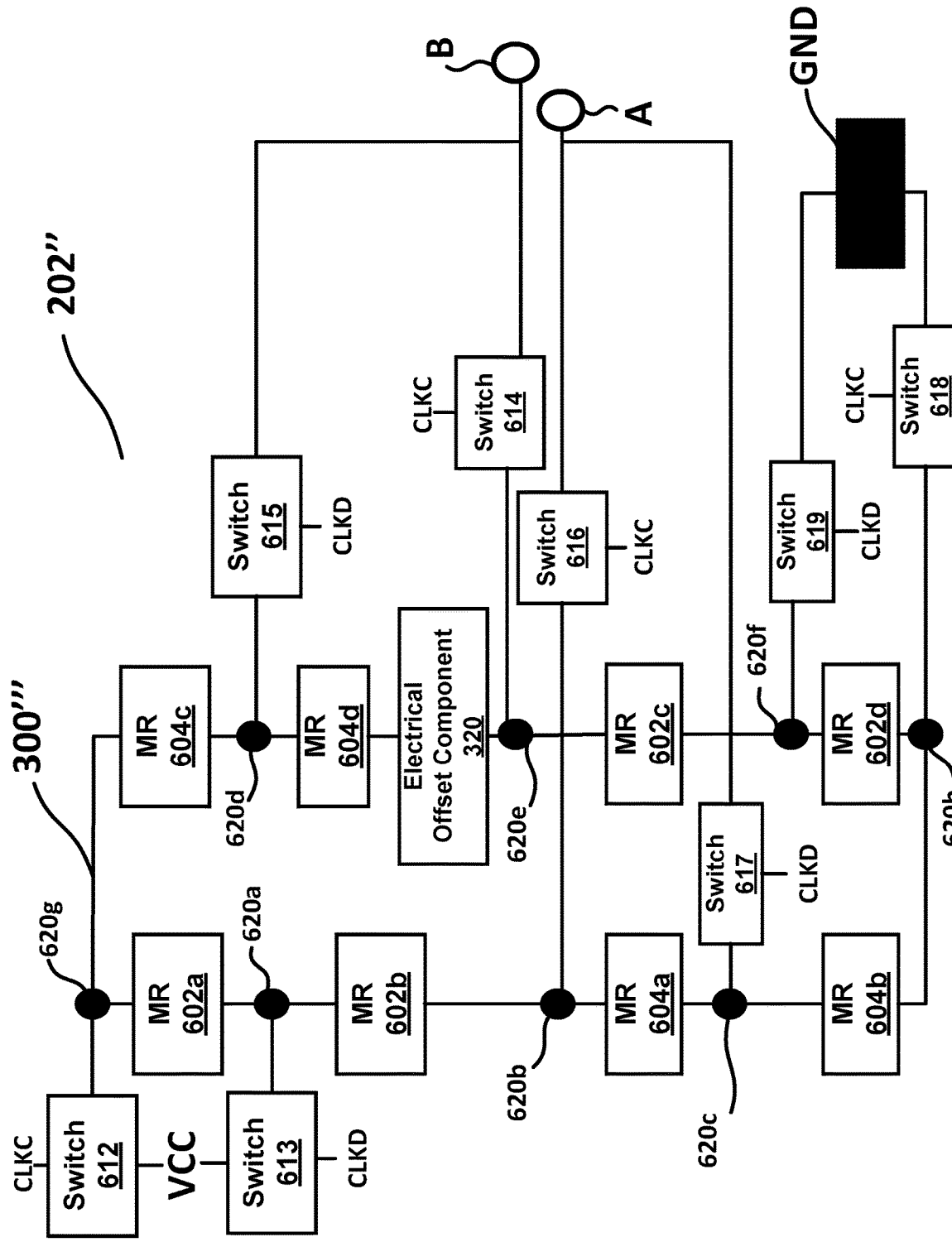
FIG. 9 is diagram of an example of bridge circuitry used to remove the effects of the electrical offset found in the bridge circuitry of FIG. 8.

Referring to FIG. 9, bridge circuitry 202" is an example of bridge circuitry 200 used to remove the effects of the electrical offset 320 found in the bridge 300" of FIG. 8. The bridge circuitry 202" includes a MR bridge 300'''. The bridge circuitry 202" includes the MR element 602a; the MR element 602b, which is connected in series with the MR element 602a at a node 620a; the MR element 604a, which is connected in series with the MR element 602b at a node 620b; the MR element 604b, which is connected in series with the MR element 604a at a node 620c; the MR element 604c; the MR element 604d, which is connected in series with the MR element 604c at a node 620d; the MR element 602c, which is connected in series with the MR element 604d at a node 620e; and the MR element 602d, which is connected in series with the MR element 602c at a node 620f.

The MR element 602a and the MR element 604c are connected to a node 620g. The MR element 602d and the MR element 604b are connected to a node 620h.

The bridge circuitry 202" also includes switches (e.g., a switch 612, a switch 613, a switch 614, a switch 615, a switch 616, a switch 617, a switch 618 and a switch 619). The switch 612 is connected at one end to a supply voltage VCC and connected at the other end to the MR element 602a and the MR element 604c at the node 620g. The switch 613 is connected at one end to the supply voltage VCC and connected at the other end to the node 620a. The switch 614 is connected to the node 620e at one end and connected at the other end to a first output terminal of the bridge circuitry. The switch 615 is connected to the node 620d at one end and connected at the other end to the first output terminal. The switch 616 is connected to the node 620b at one end and connected at the other end to a second output terminal of the bridge circuitry. The switch 617 is connected at one end to the node 620c and the other end to the second output terminal. The switch 618 is connected at one end to ground and connected at the other end to the MR element 604b and the MR element 602d at the node 620h. The switch 619 is connected at one end to ground and connected at the other end to the node 620f.

In some examples, one or more of the switches 612-619 may be a transistor. The transistor may be, for example, an n-type metal-oxide-semiconductor (NMOS) transistor.

Figure 10:
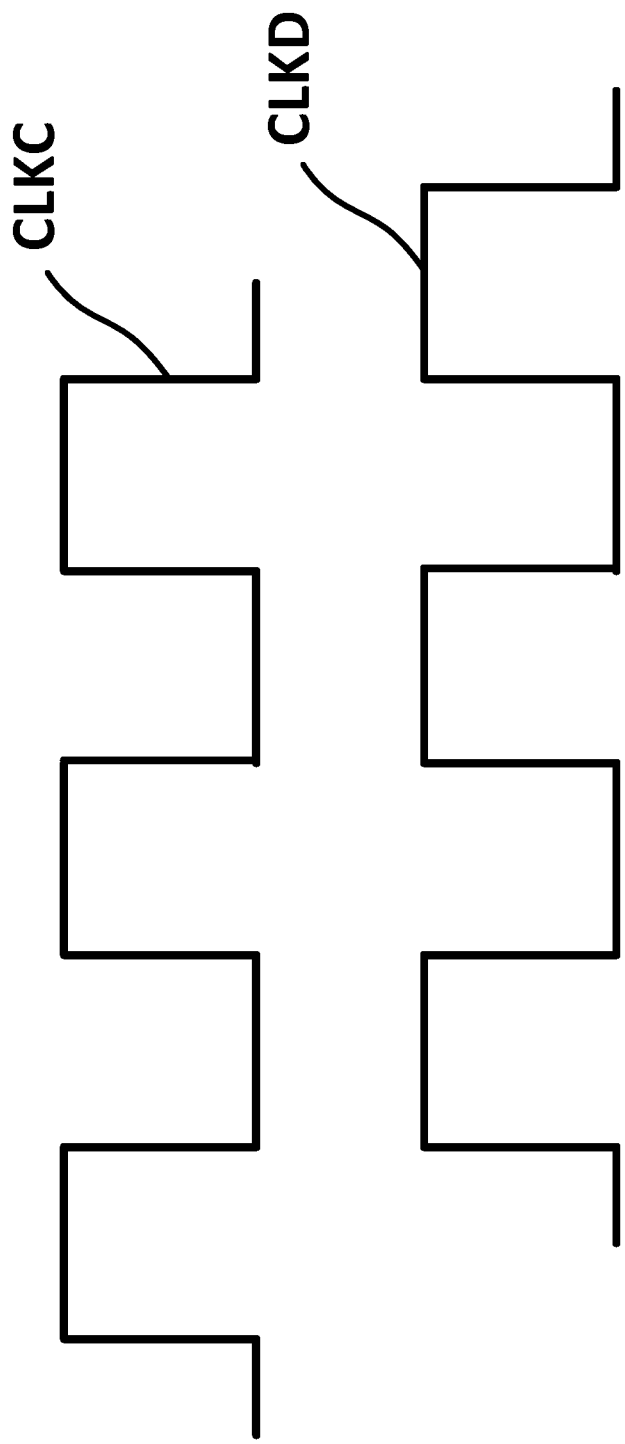
FIG. 10 is a graph of an example of a timing diagram of a third clock signal CLKC and a fourth clock signal CLKD.

The switches 612, 614, 616, 618 receive a clock signal CLKC. The switches 613, 615, 617, 619 receive a clock signal CLKD. FIG. 10 is a graph of an example of a timing diagram of the clock signal CLKC and the clock signal CLKD.

When clock signal CLKC is at a high voltage level, the clock signal CLKD is at a low voltage level. This scenario is called a third mode.

When clock signal CLKC is at a low voltage level, the clock signal CLKD is at a high voltage level. This scenario is called a fourth mode.

Figure 11B:
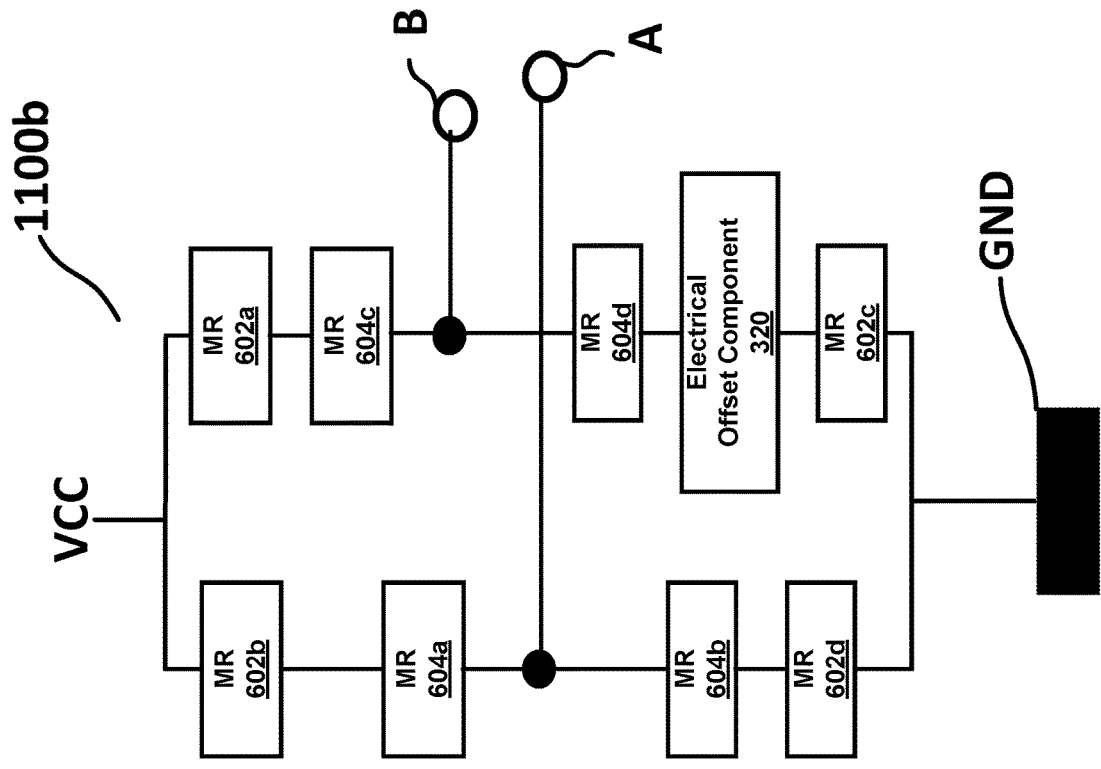
FIG. 11B is a diagram of an example of an equivalent bridge circuit of the bridge circuitry in FIG. 9 when the first clock signal CLKC is at the low voltage level and the second clock signal CLKD is at the high low voltage level.
Figure 11A:
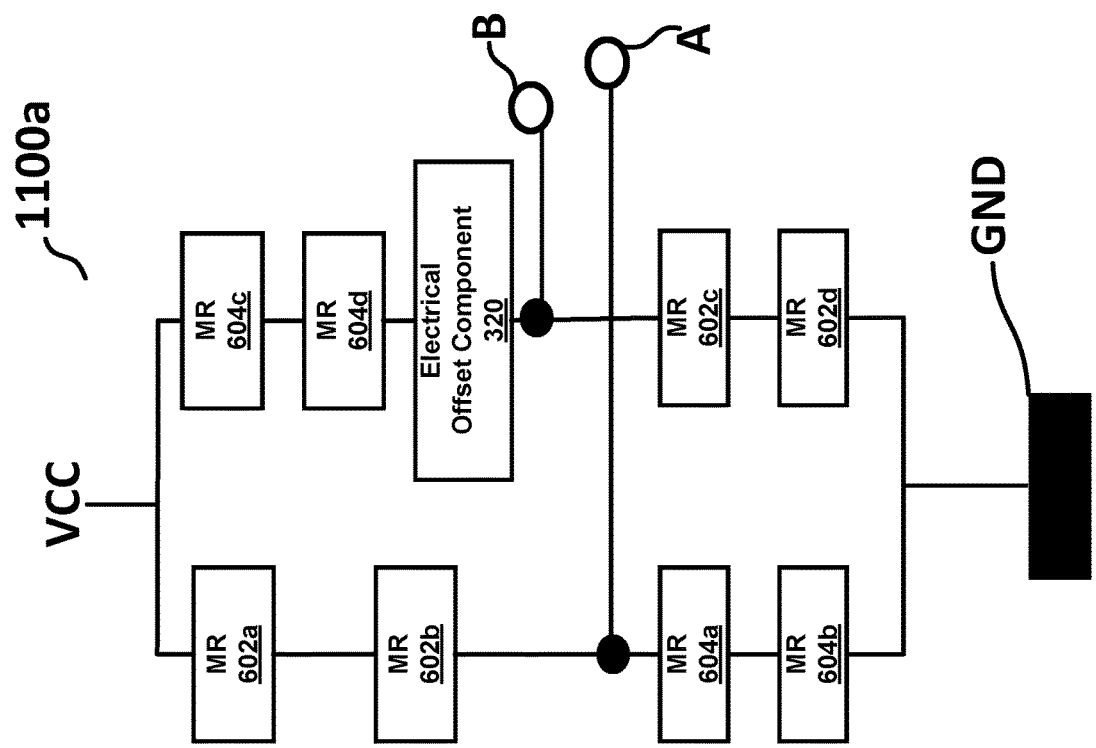
FIG. 11A is diagram of an example of an equivalent bridge circuit of the bridge circuitry in FIG. 9 when the first clock signal CLKC is at a high voltage level and the second clock signal CLKD is at a low voltage level.

Referring to FIGS. 11A and 11B, an example of an equivalent bridge circuit of the bridge circuitry 202" (FIG. 9) in the third mode is a bridge circuit 1100a. The output voltage of the bridge circuit 1100a is:

$$\text{Vout\_3rd mode}(B) \cong \frac{R2(B) - R1(B) - \Delta R/2}{R1(B) + R2(B)} \cdot VCC,$$

which is the same as bridge 300" (FIG. 8), since closing switches 612, 614, 616, 618 and opening the switches 613, 615, 617, 619 makes bridge circuit 1100a equivalent to the bridge 300" (FIG. 8).

An example of an equivalent bridge circuit of the bridge circuitry 202" (FIG. 9) in the fourth mode is a bridge circuit 1100b. The output voltage of the bridge 1100b is:

$$\text{Vout\_4th mode}(B) \cong \frac{\frac{\Delta R}{2}}{R1(B) + R2(B)} \cdot VCC.$$

Thus, adding Vout_4th mode(B) to Vout_3rd mode(B) equals:

$$\frac{R2(B) - R1(B)}{R1(B) + R2(B)} \cdot VCC,$$

which does not include the electrical offset expression ΔR.

In one example, the rate the bridge circuitry 202" switches from the third mode to the fourth mode and back to the third mode (called a switching frequency) is more than the maximum signal frequency of the magnetic-field sensor 10 (FIG. 1). In another example, the switching frequency may be twice the maximum signal frequency of the magnetic-field sensor 10 (FIG. 1). In a further example, the switching frequency is greater than 1 kHz. In other examples, the switching frequency is faster than an electrical offset drift generated by a temperature drift.

Though the preceding description described replacing a bridge TMR element in FIG. 3B with two MR elements. One of ordinary skill in the art could replace a TMR element in FIG. 3B with 3 or more elements.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. Bridge circuitry comprising:
a first magnetoresistance (MR) element;
a second MR element connected in series with the first MR element at a first node;
a third MR element connected in series with the second MR element at a second node;
a fourth MR element connected in series with the third MR element at a third node;
a fifth MR element;
a sixth MR element connected in series with the fifth MR element at a fourth node;
a seventh MR element connected in series with the sixth MR element at a fifth node;
an eighth MR element connected in series with the seventh MR element at a sixth node;
a first switch connected at one end to a supply voltage and connected at the other end to the first MR element and the fifth MR element;
a second switch connected at one end to the supply voltage and connected at the other end to the first node;
a third switch connected to the fifth node at one end and connected at the other end to a first output terminal of the bridge circuitry;
a fourth switch connected to the fourth node at one end and connected at the other end to the first output terminal;
a fifth switch connected to the second node at one end and connected at the other end to a second output terminal of the bridge circuitry;
a sixth switch connected at one end to the third node and the other end to the second output terminal;
a seventh switch connected at one end to ground and connected at the other end to the fourth MR element and the eight MR element; and
an eighth switch connected at one end to ground and connected at the other end to the sixth node.

2. The bridge circuitry of claim 1, wherein, in a first mode, the first, third, fifth and seventh switches are closed and the second, fourth, sixth, and eighth switches are open,
wherein, in a second mode, the first, third, fifth and seventh switches are open and the second, fourth, sixth, and eighth switches are closed, and
wherein taking a summation of a differential voltage output of the bridge circuitry in the first mode with a differential voltage output of the bridge circuitry in the second mode removes an electrical offset component from the differential output voltage of the bridge circuitry.

3. The bridge circuitry of claim 2, wherein the first, third, fifth and seventh switches are controlled by a first clock signal, and
wherein the second, fourth, sixth, and eighth switches are controlled by a second clock signal.

4. The bridge circuitry of claim 3, wherein when the first clock signal is at a high voltage level, the second clock signal is at a low voltage level.

5. The bridge circuitry of claim 4, wherein when the first clock signal is at a low voltage level, the second clock signal is at a high voltage level.

6. The bridge circuitry of claim 1, wherein the first MR element, the second MR element, seventh MR element and the eighth MR element are fabricated to have magnetic-field characteristics, which are substantially equal, and
wherein the third MR element, the fourth MR element, fifth MR element and the sixth MR element are fabricated to have magnetic-field characteristics, which are substantially equal.

7. The bridge circuitry of claim 6, wherein the first MR element, the second MR element, seventh MR element and the eighth MR element have magnetic-field reference directions which are substantially equal.

8. The bridge circuitry of claim 7, wherein the third MR element, the fourth MR element, fifth MR element and the sixth MR element have magnetic-field reference angles which are substantially equal.

9. The bridge circuitry of claim 8, wherein the magnetic-field reference angles of the third MR element, the fourth MR element, fifth MR element and the sixth MR element are opposite to the magnetic-field reference angles of the first MR element, the second MR element, seventh MR element and the eighth MR element.

10. The bridge circuitry of claim 8, wherein the third MR element, the fourth MR element, fifth MR element and the sixth MR element detect an external magnetic field that is an opposite direction from an external magnetic field detected by the first MR element, the second MR element, seventh MR element and the eighth MR element.

11. The bridge circuitry of claim 1, wherein the bridge circuitry is a magnetometer or a gradiometer.

12. A magnetic-field sensor comprising bridge circuitry, the bridge circuitry comprising:
a first magnetoresistance (MR) element;
a second MR element connected in series with the first MR element at a first node;
a third MR element connected in series with the second MR element at a second node;
a fourth MR element connected in series with the third MR element at a third node;
a fifth MR element;
a sixth MR element connected in series with the fifth MR element at a fourth node;
a seventh MR element connected in series with the sixth MR element at a fifth node;
an eighth MR element connected in series with the seventh MR element at a sixth node;
a first switch connected at one end to a supply voltage and connected at the other end to the first MR element and the fifth MR element;
a second switch connected at one end to the supply voltage and connected at the other end to the first node;
a third switch connected to the fifth node at one end and connected at the other end to a first output terminal of the bridge circuitry;
a fourth switch connected to the fourth node at one end and connected at the other end to the first output terminal;
a fifth switch connected to the second node at one end and connected at the other end to a second output terminal of the bridge circuitry;
a sixth switch connected at one end to the third node and the other end to the second output terminal;
a seventh switch connected at one end to ground and connected at the other end to the fourth MR element and the eight MR element; and
an eighth switch connected at one end to ground and connected at the other end to the sixth node.

13. The sensor of claim 12, wherein, in a first mode, the first, third, fifth and seventh switches are closed and the second, fourth, sixth, and eighth switches are open,
wherein, in a second mode, the first, third, fifth and seventh switches are open and the second, fourth, sixth, and eighth switches are closed, and
wherein taking a summation of a differential voltage output of the bridge circuitry in the first mode with a differential voltage output of the bridge circuitry in the second mode removes an electrical offset component from the differential output voltage of the bridge circuitry.

14. The sensor of claim 13, wherein the first, third, fifth and seventh switches are controlled by a first clock signal, and
wherein the second, fourth, sixth, and eighth switches are controlled by a second clock signal.

15. The sensor of claim 14, wherein when the first clock signal is at a high voltage level, the second clock signal is at a low voltage level.

16. The sensor of claim 15, wherein when the first clock signal is at a low voltage level, the second clock signal is at a high voltage level.

17. The sensor of claim 12, wherein the first MR element, the second MR element, seventh MR element and the eighth MR element are fabricated to have magnetic-field characteristics, which are substantially equal, and
wherein the third MR element, the fourth MR element, fifth MR element and the sixth MR element are fabricated to have magnetic-field characteristics, which are substantially equal.

18. The sensor of claim 17, wherein the first MR element, the second MR element, seventh MR element and the eighth MR element have magnetic-field reference angles which are substantially equal.

19. The sensor of claim 18, wherein the third MR element, the fourth MR element, fifth MR element and the sixth MR element have magnetic-field reference angles which are substantially equal.

20. The sensor of claim 19, wherein the magnetic-field reference angles of the third MR element, the fourth MR element, fifth MR element and the sixth MR element are opposite to the magnetic-field reference angles of the first MR element, the second MR element, seventh MR element and the eighth MR element first and fourth MR elements.

21. The sensor of claim 20, wherein the first MR element, the second MR element, seventh MR element and the eighth MR element detect an external magnetic field that is an opposite direction from an external magnetic field detected by the third MR element, the fourth MR element, fifth MR element and the sixth MR element.

22. The sensor of claim 12, wherein the bridge circuitry is a magnetometer or a gradiometer.

23. The sensor of claim 12, further comprising offset processing circuitry configured to receive the output of the bridge circuitry.

24. The sensor of claim 23, wherein the first, third, fifth and seventh switches are controlled by a first clock signal,
wherein the second, fourth, sixth, and eighth switches are controlled by a second clock signal,
wherein the offset processing circuitry comprises:

an amplifier configured to receive the output of the bridge circuitry;

a sample and hold (S&H) configured to receive an output of the amplifier, and wherein the S&H circuit is enabled by a third clock signal;

a filter configured to receive an output from the S&H circuit; and an adder configured to receive the output of the amplifier and an output of the filter.

25. The sensor of claim 24, wherein the filter is a first filter, and wherein the offset processing circuitry further comprises a second filter configured to receive an output of the adder.

26. The sensor of claim 24, wherein the S&H circuit is a first S&H circuit, and wherein the offset processing circuitry further comprises a second S&H configured to receive an output of the adder, wherein the second S&H circuit is enabled by a fourth clock signal.

27. The sensor of claim 26, wherein the fourth clock signal is equal to the first clock signal.

28. The sensor of claim 26, wherein the fourth clock cycle has a smaller duty cycle than the first clock signal.

29. The sensor of claim 24, wherein the third clock signal is equal to the second clock signal.

30. The sensor of claim 24, wherein the third clock cycle has a smaller duty cycle than the second clock signal.

31. Bridge circuitry comprises:

a first magnetoresistance (MR) element connected in series with a second MR element at a first node;

a third MR element connected in series with the first MR element at a second node;

a fourth MR element connected in series with the third MR element at a third node;

a fifth MR element connected in series with a sixth MR element at a fourth node;

a seventh MR element connected in series with the fifth MR element at a fifth node; and an eighth MR element connected in series with the seventh MR element at a sixth node; and a plurality of eight switches, wherein six of the plurality of eight switches are each connected to a corresponding one node.

32. The bridge circuitry of claim 31, wherein a seventh switch of the plurality of switches is connected to the fourth MR element and to the eighth MR element, wherein an eighth switch of the plurality of switches is connected to a supply voltage and the second MR element and the fifth MR element.

33. The bridge circuitry of claim 31, wherein, in a first mode, a first half of the plurality of switches are closed and a second half of the plurality of switches are open, wherein, in a second mode, the first half of the plurality of switches are open and the second half of the plurality are closed, and wherein taking a summation of a differential voltage output of the bridge circuitry in the first mode with a differential voltage output of the bridge circuitry in the second mode removes an electrical offset component from the differential output voltage of the bridge circuitry.

* * * * *

UNITED STATES PATENT AND TRADEMARK OFFICE
CERTIFICATE OF CORRECTION

| | | |
|---|---|---|
| PATENT NO. | : 11,953,565 B2 | Page 1 of 2 |
| APPLICATION NO. | : 17/663062 | |
| DATED | : April 9, 2024 | |
| INVENTOR(S) | : Hernán D. Romero | |

It is certified that error appears in the above-identified patent and that said Letters Patent is hereby corrected as shown below:

In the Specification

Column 3, Line 9 delete "FIG. 3B is" and replace with --FIG. 3B is a--.

Column 3, Line 14 delete "FIG. 5A is" and replace with --FIG. 5A is a--.

Column 3, Line 33 delete "FIG. 9 is" and replace with --FIG. 9 is a--.

Column 3, Line 38 delete "FIG. 11A is" and replace with --FIG. 11A is a--.

Column 3, Line 59 delete "magnetic is" and replace with --magnetic field--.

Column 6, Line 48 delete "302b and the MR element 304b" and replace with --302a and the MR element 304a--.

Column 6, Line 55 delete "202b" and replace with --302b--.

Column 8, Line 1 delete "Vout_2 nd" and replace with --Vout_2nd--.

Column 8, Line 43 delete "signal is" and replace with --signal CLKB is--.

Column 9, Line 2 delete "signal is" and replace with --signal CLKA is--.

Column 10, Line 17 delete "$Vout(B) \cong \frac{R2(B)-R1(B)-\frac{\Delta R}{2}}{R1(B)+R2(B} \cdot VCC.$" and replace with --$Vout(B) \cong \frac{R2(B)-R1(B)-\frac{\Delta R}{2}}{R1(B)+R2(B)} \cdot VCC.$--.

Signed and Sealed this
Seventh Day of January, 2025

Derrick Brent
*Acting Director of the United States Patent and Trademark Office*

CERTIFICATE OF CORRECTION (continued)
U.S. Pat. No. 11,953,565 B2

Column 10, Line 26 delete " $Vout(B) = \frac{R2(0)-R1(0)-\frac{\Delta R}{2}}{R1(0)+R2(0} \cdot VCC = -\frac{\Delta R/2}{R_{LEG}} \cdot VCC,$ " and replace with -- $Vout(B) = \frac{R2(0)-R1(0)-\frac{\Delta R}{2}}{R1(0)+R2(0)} \cdot VCC = -\frac{\Delta R/2}{R_{LEG}} \cdot VCC,$ --.

Column 11, Line 62 delete "elements. One" and replace with --elements, one--.

In the Claims

Column 12, Line 45 delete "the eight MR" and replace with --the eighth MR--.

Column 14, Line 3 delete "eight MR" and replace with --eighth MR--.